(12) United States Patent
Khwa

(10) Patent No.: US 11,573,768 B2
(45) Date of Patent: Feb. 7, 2023

(54) MEMORY DEVICE AND METHOD FOR GENERATING RANDOM BIT STREAM WITH CONFIGURABLE RATIO OF BIT VALUES

(71) Applicant: Taiwan Semiconductor Manufacturing Co., Ltd., Hsinchu (TW)

(72) Inventor: Win-San Khwa, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 437 days.

(21) Appl. No.: 16/787,023

(22) Filed: Feb. 11, 2020

(65) Prior Publication Data

US 2021/0247964 A1    Aug. 12, 2021

(51) Int. Cl.
*G11C 11/419*    (2006.01)
*G06F 7/58*    (2006.01)
*H03K 3/84*    (2006.01)
*G11C 11/412*    (2006.01)
*G11C 11/418*    (2006.01)

(52) U.S. Cl.
CPC ............ *G06F 7/582* (2013.01); *G11C 11/412* (2013.01); *G11C 11/419* (2013.01); *H03K 3/84* (2013.01); *G11C 11/418* (2013.01)

(58) Field of Classification Search
CPC .... G11C 11/412; G11C 11/418; G11C 11/419
USPC .......................................................... 365/154
See application file for complete search history.

(56) References Cited

U.S. PATENT DOCUMENTS

| | | | |
|---|---|---|---|
| 2013/0073598 A1* | 3/2013 | Jacobson | G11C 11/1697 708/250 |
| 2016/0323524 A1* | 11/2016 | Smith | H04N 5/2355 |
| 2021/0225451 A1* | 7/2021 | Seo | G11C 16/24 |

FOREIGN PATENT DOCUMENTS

EP    1367715 A1 * 12/2003 ............. G06F 7/582

* cited by examiner

*Primary Examiner* — Sung Il Cho
(74) *Attorney, Agent, or Firm* — JCIPRNET

(57) ABSTRACT

A memory device that includes a memory array and a memory controller is introduced. The memory controller is configured to adjust a program strength of the program pulse according to the configurable ratio of the first bit value and the second bit value to generate an adjusted program pulse or to adjust a bias voltage pair according to the configurable ratio of the first bit value and the second bit value to generate an adjusted bias voltage pair. The memory controller is further configured to generate the random bit stream with the configurable ratio of the first bit value and the second bit value according to the data stored in the plurality of memory cells included in the memory array after applying the adjusted program pulse or according to the data stored in the plurality of memory cells after being biased by the adjusted bias voltage pair.

13 Claims, 4 Drawing Sheets

MEMORY DEVICE AND METHOD FOR GENERATING RANDOM BIT STREAM WITH CONFIGURABLE RATIO OF BIT VALUES

BACKGROUND

A random bit stream is required in many electronic devices, circuits and computer systems. For example, a neural network that includes a plurality of processing layers that require a random bit stream for generating weights in weight initialization. If the weights for the processing layers of the neural network are not initialized randomly and properly, the processing layers of the neural network may be driven to saturation and the performance of the neural network is poor. By contrast, proper initialization of the weights for the processing layers of the neural network speeds up training convergence of the neural network, thereby reducing the processing time and improving performance of the neural network.

In some existing designs, random number generating circuits are provided to generate the random bit streams for each processing layer of the neural network. However, the addition of the random number generating circuits increases manufacturing cost and circuit size of the design. In addition, when the processing layers require random bit streams with different ratios of bit values (e.g., bit values of "1" and "0"), the design with the random number generators is hard to meet the needs. In other words, the design with the random number generating circuits has little flexibility.

There has grown a need for a creative design for generating a random bit stream with a configurable ratio of the bit values with high level of flexibility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
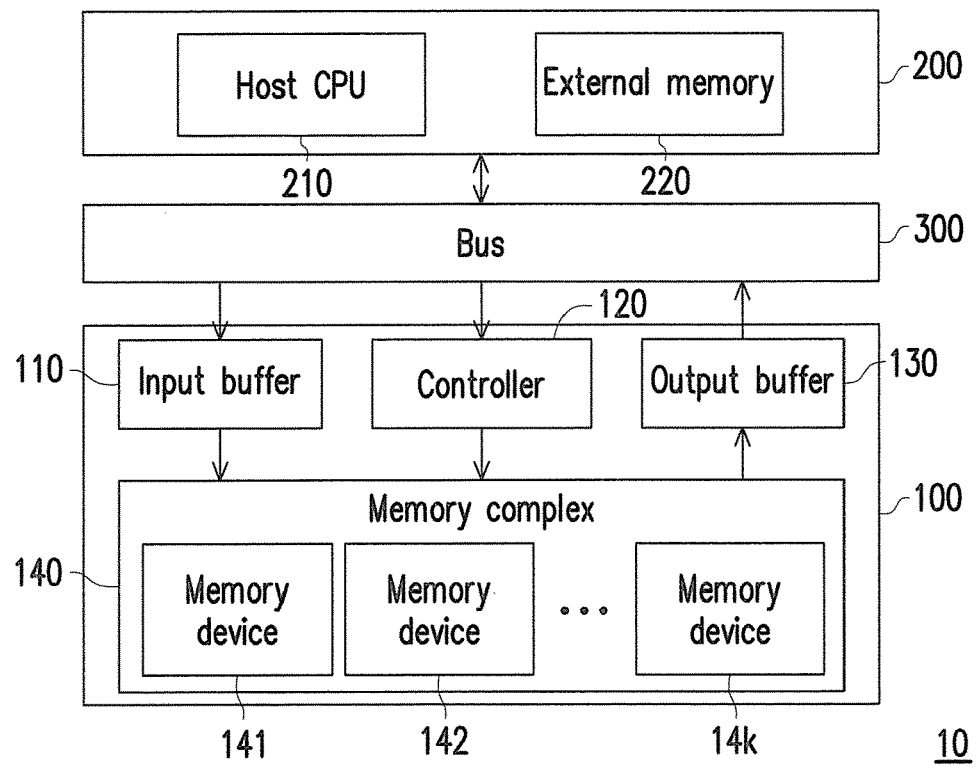
FIG. 1 is a schematic diagram illustrating a memory system.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a memory system 10 that includes a memory apparatus 100 and a host apparatus 200. The memory apparatus 100 may communicate with the host apparatus 200 through a bus 300 that may allow bi-direction communications between the memory apparatus 100 and the host apparatus 200.

The host apparatus 200 may include a host processor 210 and an external memory 220. The external memory 220 may store program codes of instructions and data. The external memory 220 may include a non-volatile memory, a volatile memory or a combination thereof. For example, the external memory 220 may include at least one of a random access memory (RAM), a dynamic random access memory (DRAM), a static random access memory (SRAM), a read only memory (ROM), a programmable read only memory (PROM), an electrically programmable read only memory (EPROM), an electrically erasable programmable read only memory (EEPROM), and flash memory. The flash memory may be a NOR flash memory or NAND flash memory.

The host processor 210 may include at least one logic circuit that is configured to control overall operations of the host apparatus 200. The host processor 210 may execute the program codes of the instructions stored in the external memory 220. The host processor 210 may exchange data and/or signals with the memory apparatus 100 through the bus 300.

The memory apparatus 100 may include an input buffer 110, a controller 120, an output buffer 130 and a memory complex 140. The input buffer 110 may act as a temporary storage for storing signals or data received from the bus 300. For example, the signals and data that are transmitted from the host apparatus 200 through the bus 300 are stored in the input buffer 110. The output buffer 130 may act as a temporary storage for storing data and signals to be outputted to the bus 300. For example, the signals and data to be transmitted to the host apparatus 200 through the bus 300 may be temporarily stored in the output buffer 130.

The memory complex 140 may include a plurality of memory devices 141 through 14k, where k is a positive integer. In some embodiments, the memory complex 140 may perform operations related to storing data and processing data for a neural network using the memory devices 141 through 14$k$. The memory complex 140 may generate random bit streams with a configurable ratio of "1" and "0" for weight initialization of processing layers of the neural network. The ratio of "1" and "0" in the random bit stream is a ratio of the percentage of "1" and the percentage of "0" in the random bit stream. For example, the memory complex 140 may generate a random bit stream with 75% of "1" and 25% of "0" for a first layer of the neural network, and generate a random bit stream with 50% of "1" and 50% of "0" for a second layer of the neural network. In some embodiments, the ratio of "1" and "0" in the random bit stream for a specific layer of the neural network may depend on the dimension of the specific layer.

The controller 120 may include logic circuits that are configured to control overall operations of the memory apparatus 100. The controller 120 may control operations of the input buffer 110, the output buffer 130 and the memory complex 140. For example, the controller 120 may control the memory complex 140 to generate the random bit streams with a configurable ratio of "1" and "0" using the memory devices 141 through 14$k$. The memory complex 140 may generate the random bit streams with a configurable ratio of "1" and "0" without use of any addition random number generating circuit.

Figure 2:
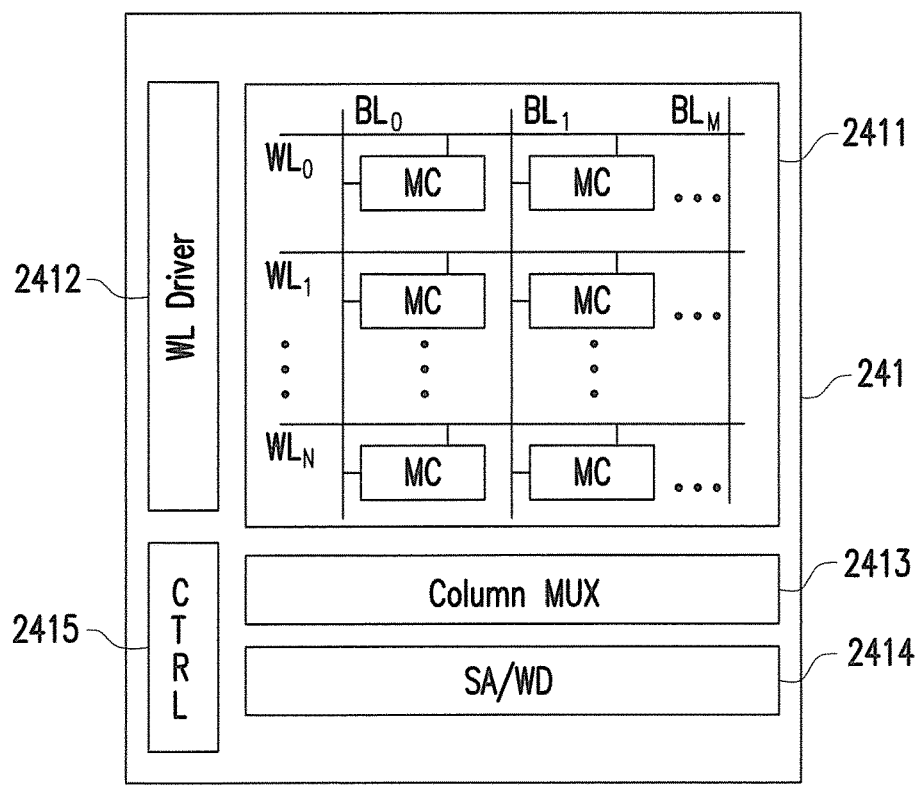
FIG. 2 is a schematic diagram illustrating a memory device.

Referring to FIG. 2, a schematic diagram of a memory device 241 is illustrated. The memory device 241 in FIG. 2 may be any one of the memory devices 141 through 14$k$ shown in FIG. 1. In some embodiments, the memory device 241 includes a memory array 2411, a word-line (WL) driver 2412, a column multiplexer 2413, a read/write circuit 2414 and a memory controller 2145. The memory array 2411 may include a plurality of memory cells MC arranged in rows in columns. The memory array 2411 may further include a plurality of word lines WL0 through WLN and a plurality of bit lines BL0 through BLM, where M and N are positive integers. Each of the memory cells MC is coupled to one of the word lines WL0 through WLN and one of the bit lines BL0 through BLM. Memory operations such as an erase operation, a program operation, a read operation, or other operation to the memory cells MC of the memory array 2141 may be performed via the word lines WL0 through WLN and the bit lines BL0 through BLM. In some embodiments, the memory cells MC of the memory array 2411 may include a plurality of non-volatile memory cells, or a plurality of volatile memory cells, or a combination thereof. The non-volatile memory cells may be resistive random-access memory (RRAM) cells, phase-change random-access memory (PCRAM) cells, magnetic random-access memory (MRAM) cells, flash memory cells, or any other suitable memory cells. The flash memory cells may be NOR memory cells or NAND memory cells. The volatile memory cells may be random-access memory (RAM) cells, dynamic RAM cells, static RAM cells or any other types of volatile memory cells.

In some embodiments, the WL driver 2412 is coupled to the word lines $WL_0$ through $WL_N$ and is configured to select or deselect at least one of the memory cells MC for a memory operation via the word lines $WL_0$ through $WL_N$. The WL driver 2412 may receive a selection signal to select at least one memory cell of the memory array 2411 as selected memory cells for the memory operation. In some embodiments, each of the memory cells MC may include an access transistor, in which the gate terminal of the access transistor is coupled to one of the word lines $WL_0$ through $WL_N$. The WL driver 2412 may control the access transistors of the memory cells MC through the word lines $WL_0$ through $WL_N$.

In some embodiments, the column multiplexer 2143 is configured to control electrical connections between the bit lines $BL_0$ through $BL_M$ and the read/write circuit 2414. The column multiplexer 2143 may electrically connect the bit lines of selected memory cells to the read/write circuit 2414 for the memory operation. In some embodiments, the read/write circuit 2414 is configured to perform the memory operations such as a program operation or a read operation to the selected memory cells via the bit lines $BL_0$ through $BL_M$. The read/write circuit 2414 may include a write driver WD and a sense amplifier SA, in which the write driver WD is configured to perform the program operation to the selected memory cells of the memory array 2411 and the sense amplifier SA is configured to perform the read operation to the selected memory cells of the memory array 2411. In some embodiments, the read/write circuit 2414 may apply a program pulse generated by a pulse generating circuit (not shown) to the selected memory cells during the program operation. The read/write circuit 2414 may read the data stored in the selected memory cells in the read operation.

In some embodiments, the memory controller 2415 is configured to control overall operations of the memory device 241. The memory controller 2415 may couple to the WL driver 2412, the column multiplexer 2413 and the read/write circuit 2444 to control the operations of these components. In some embodiments, the memory controller 2415 may control the memory array 2411, the WL driver 2412, the column multiplexer 2413 and the read/write circuit 2444 to generate random bit streams with a configurable ratio of "1" and "0". In an embodiment, the memory controller 2415 may control to adjust the program strength of the program pulse applied to the selected memory cells to adjust the ratio of "1" and "0" in the generated random bit stream. In another embodiment, the memory controller 2415 may control to adjust the bias voltages applied to the selected memory cells to adjust the ratio of "1" and "0" in the generated the random bit stream. The memory device 241 may generate random bit streams with a configurable ratio of "1" and "0" without using an additional random number generating circuit.

Figure 3:
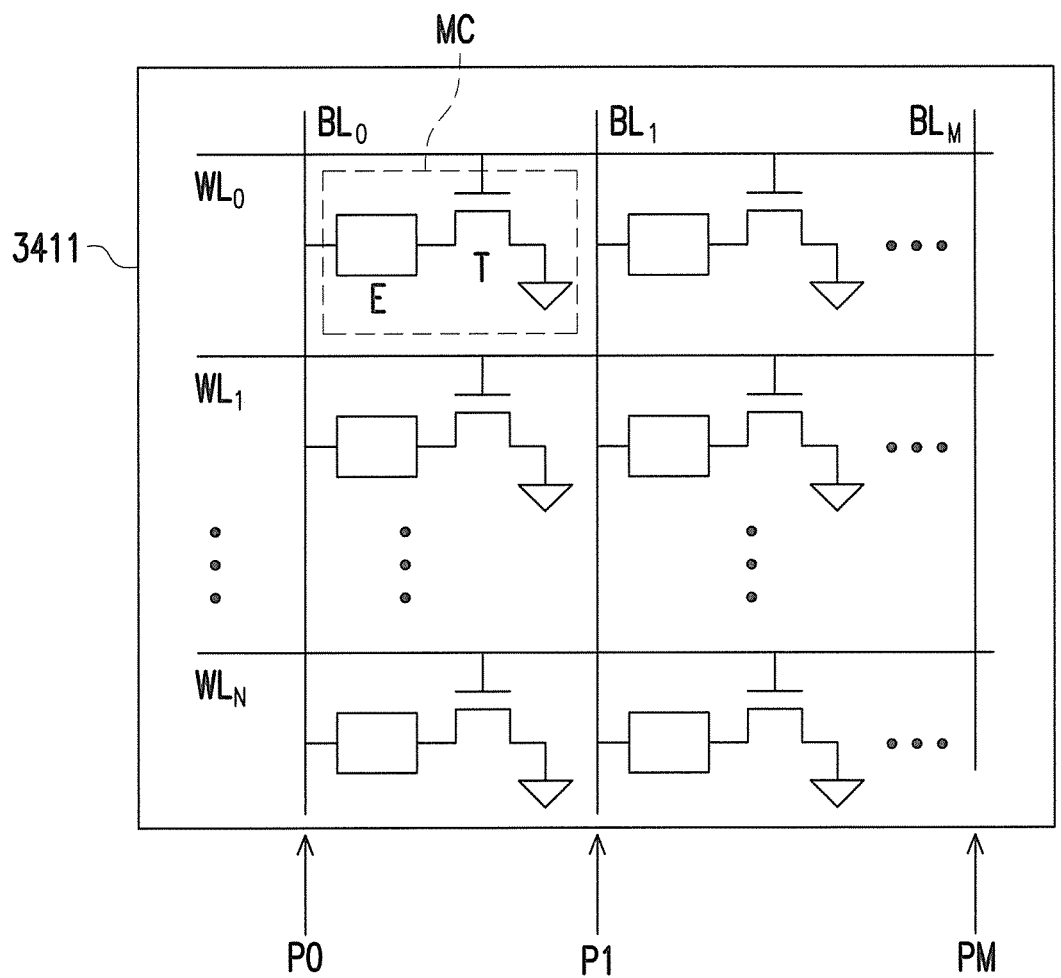
FIG. 3 is a schematic diagram illustrating a non-volatile memory array.

Referring to FIG. 3, a schematic diagram of a non-volatile memory array 3411 such as a RRAM array, a PCRAM array, a MRAM array, or a flash memory array is illustrated. The memory array 3411 may be used as the memory array 2411 of the memory device 241 illustrated in FIG. 2. The memory array 3411 may include a plurality of memory cells MC that are arranged in rows and columns, in which each memory cell MC is coupled to one of the bit lines BL0 through BLM and one of the word lines WL0 through WLN. Each memory cell MC may include a storage element E and an access transistor T. The access transistors T in the memory cells MC may have gate terminals coupled to the word lines WL0 through WLN. The memory cells MC of the memory array 3411 may be selected for a memory operation by controlling the access transistor T via the word lines WL0 through WLN. The storage elements E of the memory cells MC are used to store data of the memory cells MC. The structure and material of the storage elements E may vary according to the type of the memory cells MC. For example, when the memory cells MC are the RRAM cells, the storage element E of each memory cell MC may be or may include a resistive element for storing data of the memory cell MC. In an alternative example, when the memory cells MC are the MRAM cells, the storage element E of each memory cell MC may be or may include a magnetic tunnel junction (MTJ) device for storing the data of the memory cells MC.

In some embodiments, program pulses P0 through PM may be applied to the memory array 3411 through the bit lines BL$_0$ through BL$_M$ to generate a random bit stream. The percentages of the logic values "1" and "0" in the random bit stream may vary according to the program strength of the program pulses P0 through PM. In some embodiments, the percentage of "1" in the random bit stream increases as the program strength of the program pulses P0 through PM increases. By contrast, the percentage of "1" in the random bit stream decreases as the program strength of the program pulse s P0 through PM decreases. In some embodiments, the program strength the program pulses P0 through PM may be characterized by program widths and amplitudes of the program pulses P0 through PM. As such, the program strength of the program pulses P0 through PM is adjusted by adjusting at least one of the program widths and the amplitudes of the program pulses P0 through PM. The program pulses P0 through PM may be same or different from each other.

In some embodiments, the correspondence information between the program strength of the program pulse and the percentages of "1" and "0" in the random bit stream are stored in a lookup table. Table 1 shows an exemplary lookup table in accordance with some embodiments. The program strength in Table 1 is represented as a percentage value compared with a program strength of a predetermined program pulse. The predetermined program pulse may be the program pulse that is used to write data to the memory cells of the memory array 3411 in a program operation. As the program pulse for writing data to the memory cell may vary according to the type of the memory cells, the predetermined program pulse may be different for different types of memory cells (e.g., RRAM cells, PCRAM cells, MRAM cells, NOR cells, NAND cells).

In table 1, the program strength of "100%" indicates that the program strength of the program pulse for generating the random bit is identical to the predetermined program pulse for writing data to the memory cells of the memory array 3411. When the program strength of the program pulse P0 through PM is "100%", the generated random bit stream has the ratio of 99.9% logic value of "1" and 0.1% logic value of "0". When the program strength of the program pulse P0 through PM is "80%" the program strength of the operational program pulse, the generated random bit stream has the ratio of 75% logic value of "1" and 25% logic value of "0". As such, the program strength of the program pulses P0 through PM may be adjusted according to the lookup table as shown in Table 1 to generate the random bit stream with specific ratio of "1" and "0".

TABLE 1

| Program strength | Percentage of "1" in the random bit stream | Percentage of "0" in the random bit stream |
| --- | --- | --- |
| 100% | 99.9% | 0.1% |
| ... | ... | ... |
| 80% | 75% | 25% |
| ... | ... | ... |

To generate a random bit stream with specific ratio of "1" and "0", a program strength of the program pulse (e.g., program pulses P1 through PM) is adjusted according to the specific ratio of "1" and "0" (e.g., based on the lookup table) to generate an adjusted program pulse. The adjusted program pulse is then applied to the memory cells MC of the memory array 3411. Next, the random bit stream with the specific ratio is generated based on the data stored in the memory cells MC after the application of the adjusted program pulse. In this way, the memory device may generate the random bit streams with a configurable ratio of "1" and "0" without a need for an additional random number generating circuit.

In some embodiments, each bit value of the random bit stream is generated based on one memory cell MC. For example, four memory cells in the same memory column or in different memory columns may be used to generates a 4-bit random number with the specific ratio of "1" and "0". The program strengths of the program pulses applied to the four memory cells may be same or different from each other.

In some embodiment, each bit value of the random bit stream is generated based on multiple memory cells located in one memory column. For example, the memory cells in four different memory columns may be used to generate a 4-bit random number with the specific ratio of "1" and "0". In an example, the program pulses P0 through PM with different program strengths are applied to the bit lines BL$_0$ through BL$_M$ and an average percentage of "1" and "0" in each memory column is obtained. Each bit value of the random bit stream may be generated according to the average percentages of "1" and "0" in one memory column.

In some embodiments, the random bit streams with different ratios of "1" and "0" may be generated for weight initialization in different processing layers of a neural network. For example, when the neural network requires a first random bit stream with 75% of "1" and 25% of "0" for a first processing layer and a second random bit stream with 99.9% of "1" and 0.1% of "0" for a second processing layer, the memory device (e.g., memory device 241 in FIG. 1) may adjust the program strength to 80% and 100% for generate the first and second random bit streams, respectively.

Figure 4:
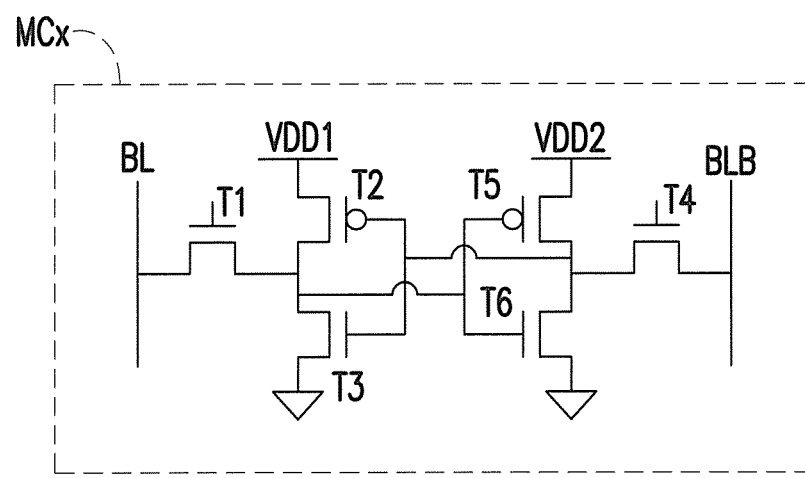
FIG. 4 is a schematic diagram illustrating a static random-access memory (SRAM) cell.

Referring to FIG. 4, a schematic diagram of a SRAM cell MCx is illustrated. The SRAM cell MCx may be a memory cell MC in the memory array 2411 shown in FIG. 2 when the memory array 2411 is a SRAM array. The SRAM cell MCx may include a plurality of transistors T1 through T6, in which the transistors T1 and T4 are access transistors. The transistors T2 and T3 may form a first latch of the SRAM cell MCx; and the transistors T5 and T6 may form a second latch of the SRAM cell MCx. The first latch of the SRAM cell MCx is biased by a bias voltage VDD1, and the second latch of the SRAM cell MCx is biased by a bias voltage VDD2, in which the bias voltages VDD1 and VDD2 form a bias voltage pair of the SRAM cell MCx.

The bias voltage pair VDD1 and VDD2 are used to bias the SRAM cell MCx during a power-up period of the SRAM cell MCx to generate the random bit stream. The ratio of "1" and "0" in the random bit stream may vary according to a voltage difference $\Delta_{VDD}$ between bias voltages VDD1 and VDD2. In some embodiments, when the bias voltage VDD1 is smaller than the bias voltage VDD2, the percentage of "1" in the random bit stream is greater than the percentage of "0" in the random bit stream. When the bias voltage VDD1 is greater than the bias voltage VDD2, the percentage of "1" in the random bit stream is smaller than the percentage of "0" in the random bit stream. As such, the bias voltages VDD1 and VDD2 of the bias voltage pair may be appropriately adjusted to generate the random bit stream with a configurable ratio of "1" and "0".

In some embodiments, the adjustment of the bias voltages VDD1 and VDD2 may be based on a lookup table that stores correspondence information between the voltage difference $\Delta_{VDD}$ and the percentages of "1" and "0" in the random bit stream is provided. The voltage difference $\Delta_{VDD}$ may be obtained by subtracting the bias voltage VDD1 from the bias voltage VDD2. Table 2 shows the lookup table in accordance with some embodiments. As shown in FIG. 2, the voltage difference $\Delta_{VDD}$ is represented as a percentage (e.g., 0%, +5%, −5%) that indicates the voltage difference $\Delta_{VDD}$ compared to the voltage level of a predetermined bias voltage. The predetermined bias voltage may be the power supply voltage VDD of the memory device.

TABLE 2

| $\Delta_{VDD}$ | Percentage of "1" in the random bit stream | Percentage of "0" in the random bit stream |
|---|---|---|
| 0% | 50% | 50% |
| +5% | 75% | 25% |
| −5% | 25% | 75% |
| ... | ... | ... |

Based on the lookup table (e.g., Table 2), the bias voltages VDD1 and VDD2 may be adjusted to generate the random bit stream with expected ratio of "1" and "0". For example, bias voltages VDD1 and VDD2 with the same voltage level may be used generate the random bit stream with the 50% of "1" and 50% of "0". In another example, the bias voltages VDD1 and VDD2, where VDD2 is 5% greater than VDD1, may be used to generate the random bit stream with the 75% of "1" and 25% of "0".

Figure 5:
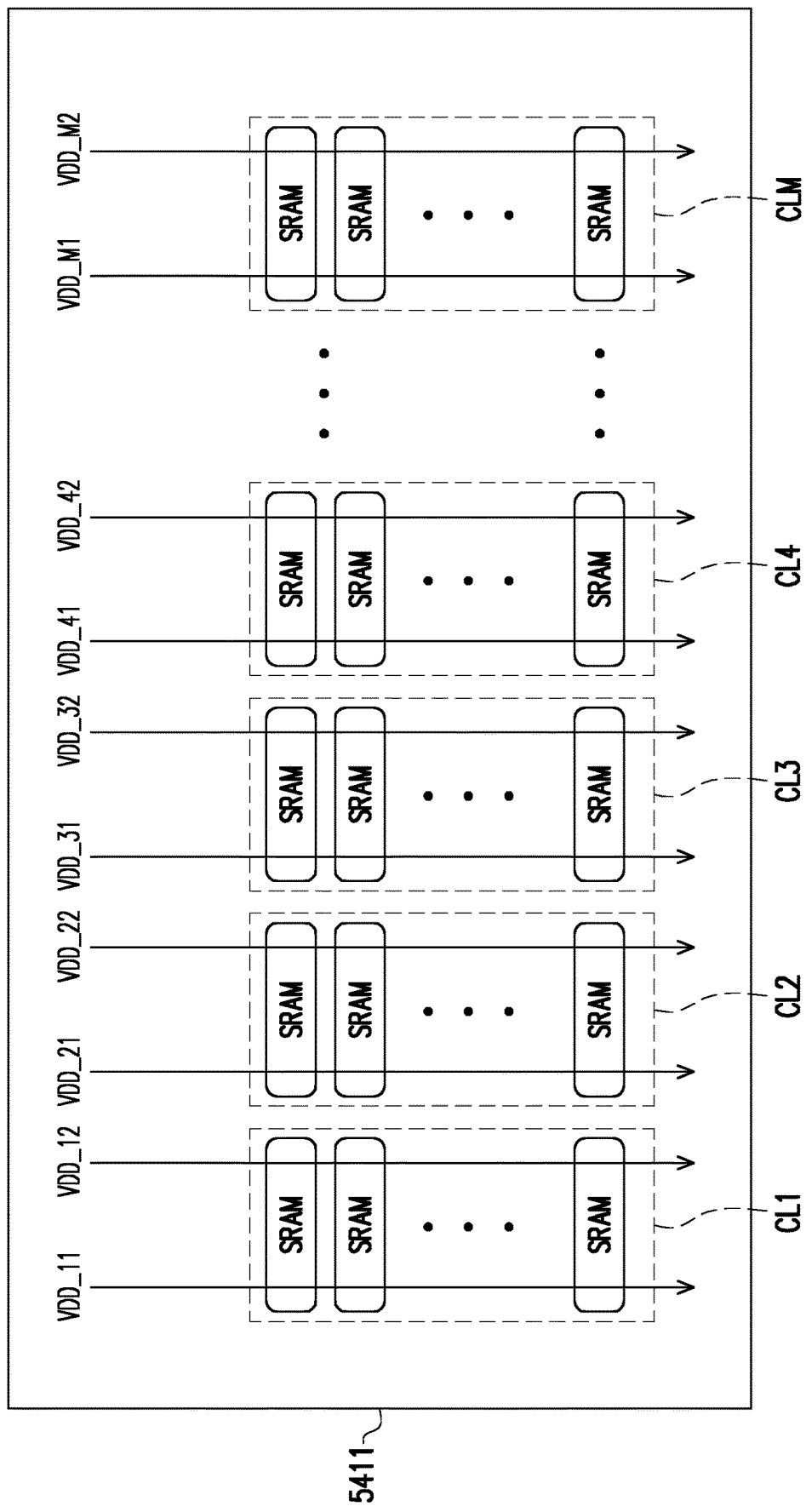
FIG. 5 is a schematic diagram illustrating a SRAM array in accordance with some embodiments.

FIG. 5 illustrates a schematic diagram of a SRAM array 5411 that may be used to generate a random bit stream with a configurable ratio of "1" and "0" in accordance with some embodiments. The SRAM array 5411 may be used as the memory array 2411 of the memory device 241 in FIG. 2. The SRAM array 5411 may include a plurality of SRAM cells arranged in memory columns CL1 through CLM, where the structure of each of the SRAM cells may be same or similar the structure of the SRAM MCx shown in FIG. 4. Each of the memory columns CL1 through CLM includes a plurality of SRAM cells that are biased by a same bias voltage pair. For example, the SRAM cells of the memory column CL1 are biased by the bias voltage pair including VDD_11 and VDD_12; the SRAM cells of the memory column CL2 are biased by the bias voltage pair including VDD_21 and VDD_22; and the SRAM cells of the memory column CLM are biased by the bias voltage pair including VDD_M1 and VDD_M2. The bias voltage pairs for the memory columns CL1 through CLM may be same or different from each other.

In some embodiments, each bit value of the random bit stream is generated based on one SRAM cell. For example, four SRAM cells may be used to generates a 4-bit random number with the configurable ratio of "1" and "0". The bias voltage pairs applied to the four SRAM cells may be same or different from each other.

In some alternative embodiments, each bit value of the random bit stream is generated based on multiple SRAM cells in one memory column. For example, the SRAM cells in the memory column CL1 are used to generate a first bit value (e.g., the most significant bit) of the 4-bit random bit stream; the SRAM cells in the memory columns CL2 and COL 3 are used to generate a second bit value and a third bit value of the 4-bit random bit stream; and the SRAM cells in the memory column CL4 are used to generate a fourth bit value (e.g., the least significant bit) of the 4-bit random bit stream.

To generate the 4-bit random bit stream with a specific ratio of "1" and "0", the bias voltage pairs may be adjusted according to a lookup table that stores correspondence information between the ratio of "1" and "0" and the voltage differences $\Delta_{VDD1}$ through $\Delta_{VDD4}$ of the bias voltage pairs for the memory columns CL1 through CL4. Table 3 illustrates an exemplary lookup table that stores the correspondence information between the ratio of "1" and "0" and the voltage differences $\Delta_{VDD1}$ through $\Delta_{VDD4}$ of the bias voltage pairs. As shown in Table 3, when the bias voltages VDD_11 and VDD_12 with the voltage difference $\Delta_{VDD1}$ of 0% are used to bias the SRAM cells in the memory column CL1, the first bit value (MSB) of the 4-bit random bit stream has 50% of being "1" and 50% of being "0". In another example, when the bias voltages VDD_11 and VDD_12 with the voltage difference $\Delta_{VDD1}$ of 5% are used to bias the SRAM cells in the memory column CL1, the first bit value (MSB) of the 4-bit random bit stream has 75% of being "1" and 25% of being "0". As such, by appropriately adjusting the bias voltage pairs for the memory column CL1 through CL4, the 4-bit random bit stream with the specific ratio of "1" and "0" are obtained without a need of an additional random number generating circuit.

Table 3 further shows an average value of the 4-bit random bit stream corresponding to voltage differences $\Delta_{VDD1}$ through $\Delta_{VDD4}$ of the bias voltage pairs. The random bit stream with the specific average value may be obtained by setting appropriate bias voltage pairs. For example, to generate the 4-bit random bit having the average value of 7.5, the voltage differences $\Delta_{VDD1}$ through $\Delta_{VDD4}$ of the bias voltage pairs for the memory columns CL1 through CL4 should be all "0%".

TABLE 3

| Average 4-bit value (0-15) | $\Delta_{VDD1}$ | $\Delta_{VDD2}$ | $\Delta_{VDD3}$ | $\Delta_{VDD4}$ | %1/%0 in CL1 | %1/%0 in CL2 | %1/%0 in CL3 | %1/%0 in CL4 |
|---|---|---|---|---|---|---|---|---|
| 7.5 | 0% | 0% | 0% | 0% | 50%/50% | 50%/50% | 50%/50% | 50%/50% |
| 9.5 | +5% | 0% | 0% | 0% | 75%/25% | 50%/50% | 50%/50% | 50%/50% |
| 8.5 | 0% | +5% | 0% | 0% | 50%/50% | 75%/25% | 50%/50% | 50%/50% |
| 8.0 | 0% | 0% | +5% | 0% | 50%/50% | 50%/50% | 75%/25% | 50%/50% |
| 7.75 | 0% | 0% | 0% | +5% | 50%/50% | 50%/50% | 50%/50% | 75%/25% |
| ... | ... | ... | ... | ... | ... | ... | ... | ... |

Table 4 shows another example of a lookup table that may be used to generate the 4-bit random bit stream with specific ratio of "1" and "0" using the SRAM array. A difference between the Table 3 and Table 4 is that multiple bias voltage pairs may be adjusted at the same time in Table 4. In the example shown in Table 4, two bias voltage pairs are adjusted at the same time to generate the random bit stream with more flexible ratio of "1" and "0". For example, the bias voltage pairs having the voltage differences $\Delta_{VDD1}$ (5%) and $\Delta_{VDD2}$ (5%) may be applied to the memory columns CL1 and CL2 at the same time to generate the random bit stream with the average value of 10.5. In another example, the bias voltage pairs having the voltage differences $\Delta_{VDD1}$ (5%) and $\Delta_{VDD4}$ (5%) may be applied to the memory columns CL1 and CL4 at the same time to generate the random bit stream with the average value of 9.75. By adjusting multiple bias voltage pairs at the same time, the random bit stream with the configurable ratio of "1" and "0" is generated with high level of flexibility. It is noted that the number of bias voltage pairs being adjusted simultaneously are not limited to two bias voltage pairs as shown in Table 4.

TABLE 4

| Average 4-bit value (0-15) | $\Delta_{VDD1}$ | $\Delta_{VDD2}$ | $\Delta_{VDD3}$ | $\Delta_{VDD4}$ | %1/%0 in CL1 | %1/%0 in CL2 | %1/%0 in CL3 | %1/%0 in CL4 |
|---|---|---|---|---|---|---|---|---|
| 10.5 | +5% | +5% | 0% | 0% | 75%/25% | 75%/25% | 50%/50% | 50%/50% |
| 9.0 | 0% | +5% | +5% | 0% | 50%/50% | 75%/25% | 75%/25% | 50%/50% |
| 8.25 | 0% | 0% | +5% | +5% | 50%/50% | 50%/50% | 75%/25% | 75%/25% |
| 9.75 | +5% | 0% | 0% | +5% | 75%/25% | 50%/50% | 75%/25% | 50%/50% |
| ... | ... | ... | ... | ... | ... | ... | ... | ... |

Figure 6:
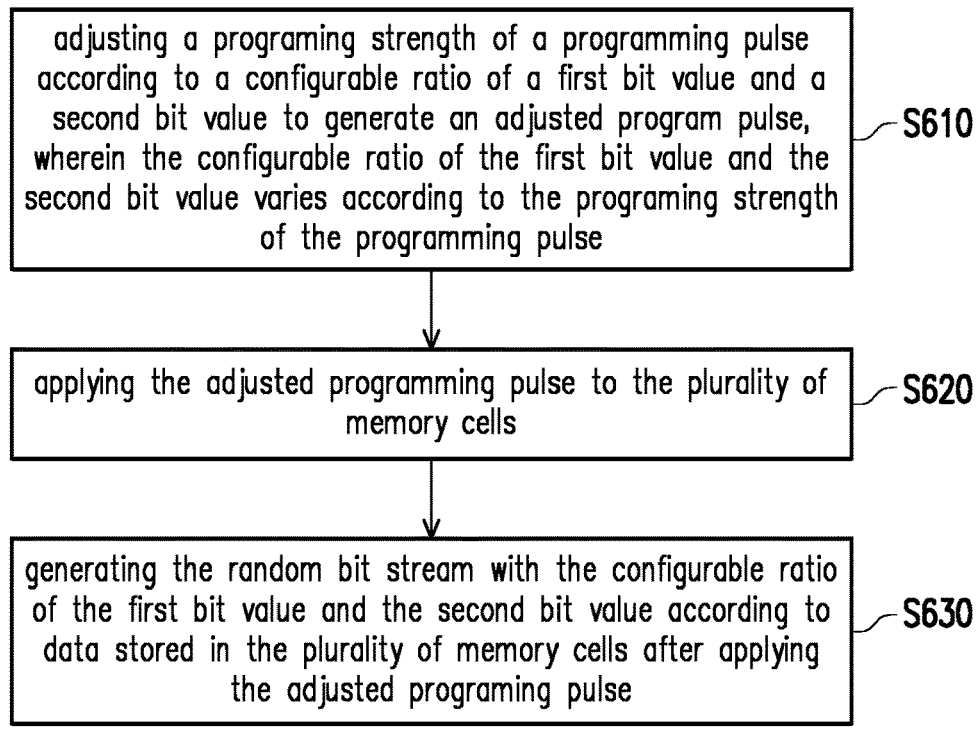
FIG. 6 is a flowchart diagram illustrating a method of generating a random bit stream with a configurable ratio of a first bit value and a second bit value in accordance with some embodiments.

Referring to FIG. 6, a method of generating a random bit stream with a configurable ratio of a first bit value (e.g., "1") and a second bit value (e.g., "0") is illustrated in accordance with some embodiments. In step S610, a program strength of a program pulse is adjusted according to the configurable ratio of the first bit value and the second bit value, wherein the configurable ratio of the first bit value and the second bit value vary according to the program strength of the program pulse. In some embodiments, the program strength of the program pulse may be adjusted by adjusting at least one of a pulse width and an amplitude of the program pulse. In step S620, the adjusted program pulse is applied to the plurality of memory cells. In step S630, the random bit stream with the configurable ratio of the first bit value and the second bit value is generated according to data stored in the plurality of memory cells after applying the adjusted program pulse.

Figure 7:
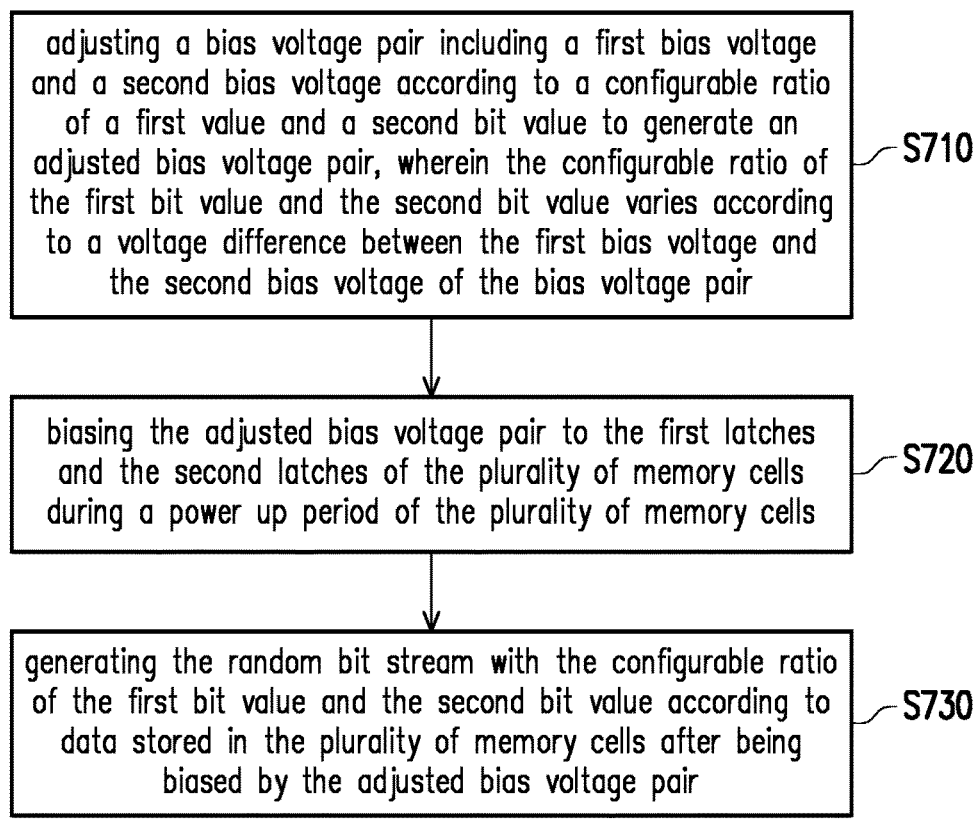
FIG. 7 is a flowchart diagram illustrating a method of generating a random bit stream with a configurable ratio of a first bit value and a second bit value in accordance with some embodiments.

Referring to FIG. 7, a method of generating a random bit stream with a configurable ratio of a first bit value and a second bit value in accordance with some embodiments is illustrated. In step S710, a bias voltage pair including a first bias voltage and a second bias voltage is adjusted according to the configurable ratio of the first value and the second bit value to generate an adjusted bias voltage pair. The configurable ratio of the first bit value and the second bit value varies according to a voltage difference between the first bias voltage and the second bias voltage of the bias voltage pair. In step S720, the adjusted bias voltage pair is used to bias the first latches and the second latches of the plurality of memory cells during a power-up period of the plurality of memory cells. In step S730, the random bit stream with the configurable ratio of the first bit value and the second bit value is generated according to data stored in the plurality of memory cells after being biased by the adjusted bias voltage pair.

In accordance with some embodiments, the random bit stream is generated by using memory cells of a memory device. The ratio of the bit values (e.g., bit values of "1" and "0") is configurable by adjusting a program strength of a program pulse applied to the memory cells in some embodiments. The ratio of the bit values (e.g., bit values of "1" and "0") is configurable by adjusting the bias voltage pair that is used to bias the memory cells during the power-up period of the memory cells in some other embodiments. As such, the random bit stream with a configurable ratio of "1" and "0" is generated without a need for an additional random number generating circuit. Accordingly, the cost and design space for the additional random number generating circuit is saved. In addition, the method and device introduced in the disclosure may generate random bit streams with different ratios of "1" and "0" for different processing layers of a neural network with high level of flexibility. It may help to speed up the training convergence and to improve the performance of the neural network.

In accordance with some embodiments, a method of generating random bit stream with a configurable ratio of a first bit value and a second bit value using a plurality of memory cells is introduced. The method includes steps of adjusting a program strength of a program pulse according to the configurable ratio of the first bit value and the second bit value to generate an adjusted program pulse, wherein the configurable ratio of the first bit value and the second bit value varies according to the program strength of the program pulse; applying the adjusted program pulse to the plurality of memory cells; and generating the random bit stream with the configurable ratio of the first bit value and the second bit value according to data stored in the plurality of memory cells after applying the adjusted program pulse.

In accordance with some embodiments, a method of generating random bit stream with a configurable ratio of a first bit value and a second bit value using a plurality of memory cells is introduced. Each of the plurality of memory cells comprises a first latch and a second latch. The method includes steps of adjusting a bias voltage pair including a first bias voltage and a second bias voltage according to the configurable ratio of the first value and the second bit value to generate an adjusted bias voltage pair, wherein the configurable ratio of the first bit value and the second bit value varies according to a voltage difference between the first bias voltage and the second bias voltage of the bias voltage pair; biasing the adjusted bias voltage pair to the first latches and the second latches of the plurality of memory cells during a power-up period of the plurality of memory cells; and generating the random bit stream with the configurable ratio of the first bit value and the second bit value according to data stored in the plurality of memory cells after being biased by the adjusted bias voltage pair.

In accordance with some embodiments, a memory device that includes a memory array and a memory controller is introduced. The memory array includes a plurality of memory cells. The memory controller is coupled to the memory array and is configured to generate random bit stream with a configurable ratio of a first bit value and a second bit value using the plurality of the memory cells. The memory controller is configured to adjust a program strength of the program pulse according to the configurable ratio of the first bit value and the second bit value to generate an adjusted program pulse or to adjust a bias voltage pair according to the configurable ratio of the first bit value and the second bit value to generate an adjusted bias voltage pair. The memory controller is further configured to generate the random bit stream with the configurable ratio of the first bit value and the second bit value according to the data stored in the plurality of memory cells after applying the adjusted program pulse or according to the data stored in the plurality of memory cells after being biased by the adjusted bias voltage pair.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of generating a random bit stream using a plurality of memory cells, comprising:
   adjusting at least one of a pulse width and an amplitude of a program pulse according to a configurable ratio of a first bit value and a second bit value to generate an adjusted program pulse, wherein the configurable ratio of the first bit value and the second bit value varies according to the at least one of the pulse width and the amplitude of the program pulse, and the configurable ratio is a ratio of a first percentage of the first logic value in the random bit stream and a second percentage of the second logic value in the random bit stream;
   applying the adjusted program pulse to the plurality of memory cells; and
   generating the random bit stream with the configurable ratio of the first bit value and the second bit value according to data stored in the plurality of memory cells after applying the adjusted program pulse,
   wherein the first percentage of the first logic value in the random bit stream increases and the second percentage of the second logic value in the random bit stream decreases as the at least one of the pulse width and the amplitude of the program pulse increases, and
   the first percentage of the first logic value in the random bit stream decreases and the second percentage of the second logic value in the random bit stream increases as the at least one of the pulse width and the amplitude of the program pulse decreases.

2. The method of claim 1, wherein
   the plurality of memory cells are non-volatile memory cells, and
   the random bit stream with the configurable ratio of the first bit value and the second bit value is generated according to the data stored in the plurality of memory cells without use of an additional random number generating circuit.

3. The method of claim 2, wherein
   the plurality of memory cells are arranged in a plurality of memory columns,
   the adjusted program pulse comprises a plurality of column program pulses corresponding to the plurality of memory columns, and
   applying the adjusted program pulse to the plurality of memory cells comprises:
       applying each of the column program pulses to a corresponding one of the memory columns.

4. The method of claim 3, wherein
   each bit of the random bit stream is generated according to data stored in memory cells in one of the plurality of memory columns.

5. A method of generating a random bit stream using a plurality of memory cells, each of the plurality of memory cells comprises a first latch and a second latch, the method comprising:
   adjusting a bias voltage pair including a first bias voltage and a second bias voltage according to a configurable ratio of a first value and a second bit value to generate an adjusted bias voltage pair, wherein the configurable ratio of the first bit value and the second bit value varies according to a voltage difference between the first bias voltage and the second bias voltage of the bias voltage pair, wherein the configurable ratio is a ratio of a first percentage of the first logic value in the random bit stream and a second percentage the second logic value in the random bit stream;
   biasing the adjusted bias voltage pair to the first latches and the second latches of the plurality of memory cells during a power-up period of the plurality of memory cells; and
   generating the random bit stream with the configurable ratio of the first bit value and the second bit value according to data stored in the plurality of memory cells after being biased by the adjusted bias voltage pair,
   wherein when the first bias voltage is smaller than the second bias voltage, the first percentage of the first logic value in the random bit stream is greater than the second percentage of the second logic value in the random bit stream, and
   when the first bias voltage is greater than the second bias voltage, the first percentage of the first logic value in the random bit stream is smaller than the second percentage of the second logic value in the random bit stream.

6. The method of claim 5, wherein
   the plurality of memory cells are static random access memory cells, and
   the random bit stream with the configurable ratio of the first bit value and the second bit value is generated according to data stored in the plurality of memory cells without use of an additional random number generating circuit.

7. The method of claim 6, wherein
   the plurality of memory cells are arranged in a plurality of memory columns,
   the adjusted bias voltage pair comprises a plurality of column bias voltage pairs corresponding to the plurality of memory columns, and
   biasing the adjusted bias voltage pair to the first latches and the second latches of the plurality of memory cells comprises:
       biasing each of the column bias voltage pairs to the first latch and the second latch of a corresponding one of the memory columns.

8. The method of claim 7, wherein
   each bit of the random bit stream is generated according to data stored in memory cells in one of the plurality of memory columns.

9. A memory device, comprising:
   a memory array, comprising a plurality of memory cells;
   a memory controller, coupled to the memory array, configured to generate a random bit stream with a configurable ratio of a first bit value and a second bit value using the plurality of the memory cells,
   wherein the memory controller is configured to adjust at least one of a pulse width and an amplitude of the program pulse according to the configurable ratio of the first bit value and the second bit value to generate an adjusted program pulse or to adjust a bias voltage pair according to the configurable ratio of the first bit value and the second bit value to generate an adjusted bias voltage pair, wherein the configurable ratio is a ratio of a first percentage of the first logic value in the random bit stream and a second percentage of the second logic value in the random bit stream, and
   the memory controller is further configured to generate the random bit stream with the configurable ratio of the first bit value and the second bit value according to the data stored in the plurality of memory cells after applying the adjusted program pulse or according to the data stored in the plurality of memory cells after being biased by the adjusted bias voltage pair, wherein the first percentage of the first logic value in the random bit stream increases and the second percentage of the second logic value in the random bit stream decreases as the at least one of the pulse width and the amplitude of the program pulse increases, and the first percentage of the first logic value in the random bit stream decreases and the second percentage of the second logic value in the random bit stream increases as the at least one of the pulse width and the amplitude of the program pulse decreases.

10. The memory device of claim 9, further comprising:
a read/write circuit, coupled to the memory array and the memory controller, configured to apply the adjusted program pulse to the plurality of memory cells to the plurality of memory cells.

11. The memory device of claim 9, wherein
the plurality of memory cells are non-volatile memory cells that are arranged in a plurality of memory columns,
the adjusted program pulse comprises a plurality of column program pulses corresponding to the plurality of memory columns,
the memory controller is further configured to apply each of the column program pulses to a corresponding one of the memory columns, and
each bit of the random bit stream is generated according to data stored in memory cells in one of the plurality of memory columns.

12. The memory device of claim 9, wherein
the plurality of memory cells are static random access memory cells that are arranged in a plurality of memory columns,
the adjusted bias voltage pair comprises a plurality of column bias voltage pairs corresponding to the plurality of memory columns,
the memory controller is further configured to bias each of the column bias voltage pairs to a corresponding one of the memory columns, and
each bit of the random bit stream is generated according to data stored in memory cells in one of the plurality of memory columns.

13. The memory device of claim 9, wherein
the random bit stream with the configurable ratio of the first bit value and the second bit value is generated according to the data stored in the plurality of memory cells without use of an additional random number generating circuit.

* * * * *